US009128128B2

(12) United States Patent
Fries et al.

(10) Patent No.: US 9,128,128 B2
(45) Date of Patent: Sep. 8, 2015

(54) CURRENT SENSOR

(75) Inventors: Jeffrey Michael Fries, Melbourne, FL (US); Jeffery Armstrong, Palm Bay, FL (US); Robert N. Bettis, West Melbourne, FL (US); Bradley Dale Brown, Winnipeg (CA); Shawn T. Clark, Melbourne, FL (US); Gregory K. Hann, Odessa, MO (US); Mark Kraeling, Melbourne, FL (US); Steve R. Murphy, West Melbourne, FL (US); Daniel G. Penny, III, Melbourne, FL (US); Eric Vorndran, Melbourne, FL (US)

(73) Assignee: General Electric Company, Schenectady, NY (US)

( * ) Notice: Subject to any disclaimer, the term of this patent is extended or adjusted under 35 U.S.C. 154(b) by 628 days.

(21) Appl. No.: 13/158,235

(22) Filed: Jun. 10, 2011

(65) Prior Publication Data

US 2012/0314332 A1     Dec. 13, 2012

(51) Int. Cl.
G08B 23/00 (2006.01)
H01H 47/00 (2006.01)
G01R 15/18 (2006.01)
G01R 19/20 (2006.01)

(52) U.S. Cl.
CPC .............. *G01R 15/185* (2013.01); *G01R 19/20* (2013.01)

(58) Field of Classification Search
None
See application file for complete search history.

(56) References Cited

U.S. PATENT DOCUMENTS

| | | | | |
|---|---|---|---|---|
| 4,691,270 A | * | 9/1987 | Pruitt | 363/56.05 |
| 4,749,940 A | * | 6/1988 | Bullock | 324/127 |
| 4,887,027 A | * | 12/1989 | Strasser | 324/117 H |
| 5,296,802 A | * | 3/1994 | Beranger et al. | 324/117 R |
| 5,811,965 A | * | 9/1998 | Gu | 324/117 R |
| 7,650,210 B2 | | 1/2010 | Breed | |
| 7,812,585 B2 | | 10/2010 | Zhou et al. | |
| 8,160,195 B2 | * | 4/2012 | Muthu-Manivannan et al. | 375/371 |
| 8,624,587 B2 | * | 1/2014 | Popovic et al. | 324/207.22 |
| 2007/0257662 A1 | * | 11/2007 | Mende et al. | 324/117 R |

(Continued)

FOREIGN PATENT DOCUMENTS

| | | |
|---|---|---|
| DE | 102011002756 A | 7/2012 |
| GB | 1488262 A | 10/1977 |

(Continued)

OTHER PUBLICATIONS

Search Report and Written Opinion issued in corresponding application No. PCT/US2012/040476 dated Dec. 13, 2012.

*Primary Examiner* — Julie Lieu
(74) *Attorney, Agent, or Firm* — GE Global Patent Operation (57) ABSTRACT

There is provided a voltage or current sensing device. An exemplary voltage or current sensing device includes a drive circuitry configured to deliver a drive current to a magnetic core operably coupled with a conductor, for driving the core to cyclical magnetic saturation. The device also includes sense circuitry configured to receive a voltage signal corresponding to an application current in the conductor. The device also includes signal processing circuitry configured to sample the voltage signal, wherein a first sample is in phase with the drive current and a second sample is out of phase with the drive current. The device also includes a feedback loop configured to deliver a compensation current to the magnetic core, wherein the compensation current is configured to balance the magnetic core and wherein the compensation current is based at least in part on the first sample in phase with the drive current.

23 Claims, 6 Drawing Sheets

(56) References Cited

U.S. PATENT DOCUMENTS

| | | |
|---|---|---|
| 2008/0309155 A1 | 12/2008 | Audrezet et al. |
| 2009/0108833 A1 | 4/2009 | Ziegler et al. |
| 2011/0006753 A1 | 1/2011 | Yu |
| 2012/0194171 A1* | 8/2012 | Blakely .................... 324/117 R |

FOREIGN PATENT DOCUMENTS

| | | |
|---|---|---|
| WO | 2010082115 A1 | 7/2010 |
| WO | 2012098054 A1 | 7/2012 |

* cited by examiner

CURRENT SENSOR

BACKGROUND

Exemplary embodiments of the invention relate generally to a system and method for sensing current in a conductor. Moreover, such embodiments may relate to sensing current in conductors used in positive train control systems such as wayside control systems.

As part of the US federal legislation (HR2095 Railroad Safety Act), railroads are to implement interoperable Positive Train Control (PTC) by Dec. 31, 2015 on mainlines with passenger/commuter rail traffic and on mainlines which transport Toxic Inhalation Hazard (TIH) materials. To upgrade to interoperable PTC, railroads can implement wayside technologies that enable wireless communications of signal aspect, switch position, and hazard detector status information to the locomotive and/or a central control facility. In some cases, wayside signaling locations may be controlled by relays or other equipment that cannot be easily upgraded to obtain the signal status information via software. In such cases, information such as signal status can be determined by installing sensors on the wires to the signal lamps. Electrical interference or internal failure may cause current or voltage sensors to be susceptible to providing incorrect information. Accordingly, a reliable technique for sensing current in a conductor may be desirable.

BRIEF DESCRIPTION

Briefly, in accordance with an embodiment of the invention, there is provided a voltage or current sensing device. An exemplary voltage or current sensing device includes a drive circuitry configured to deliver a drive current to a magnetic core operably coupled with a conductor, for driving the core to cyclical magnetic saturation. The voltage or current sensing device also includes sense circuitry configured to receive a voltage signal corresponding to an application current in the conductor. The voltage or current sensing device also includes signal processing circuitry configured to sample the voltage signal, wherein a first sample is in phase with the drive current and a second sample is out of phase with the drive current. The voltage or current sensing device also includes a feedback loop configured to deliver a compensation current to the magnetic core, wherein the compensation current is configured to balance the magnetic core and wherein the compensation current is based at least in part on the first sample in phase with the drive current.

In one embodiment, a signaling system is provided. The exemplary signaling system includes a signal lamp configured to indicate a condition of a railway. A voltage or current sensor is operably coupled with a conductor corresponding to the signal lamp, the voltage or current sensor configured to detect a state of the signal lamp. The voltage or current sensor may include a magnetic core disposed about the conductor. Drive circuitry delivers a drive current to the magnetic core, wherein the drive current drives the core to cyclical magnetic saturation. Sense circuitry is configured to receive a voltage signal corresponding to an application current in the conductor. Signal processing circuitry is configured to sample the voltage signal, wherein a first sample is in phase with the drive current and a second sample is out of phase with the drive current. A feedback loop drives a compensation current to the magnetic core, wherein the compensation current is configured to balance the magnetic core and wherein the compensation current is based on the first sample in phase with the drive current.

One embodiment relates to a method of measuring voltage or current. An exemplary method includes delivering a drive current to a magnetic core, wherein the drive current drives the core to cyclical magnetic saturation. A voltage signal corresponding to an application current in a conductor operably coupled with the magnetic core is received. The method also includes sampling the voltage signal, wherein a first sample is in phase with the drive current and a second sample is out of phase with the drive current. The method additionally includes delivering a compensation current to the magnetic core, wherein the compensation current is configured to balance the magnetic core and wherein the compensation current is based on the first sample in phase with the drive current.

One embodiment relates to a fluxgate sensor. The exemplary fluxgate sensor includes a sensor unit and a detection device configured to be operably coupled with the sensor unit. The detection device is further configured, when coupled with the sensor unit and when the sensor unit is operably coupled with a conductor, to sample a voltage signal of the sensor unit, the voltage signal induced in the sensor unit by a current passing through the conductor. The detection device is further configured to generate a compensation current for the sensor unit based at least in part on the voltage signal as sampled.

DRAWINGS

These and other features, aspects, and advantages of embodiments of the invention will become better understood when the following detailed description is read with reference to the accompanying drawings in which like characters represent like parts throughout the drawings, wherein.

DETAILED DESCRIPTION

Figure 1:
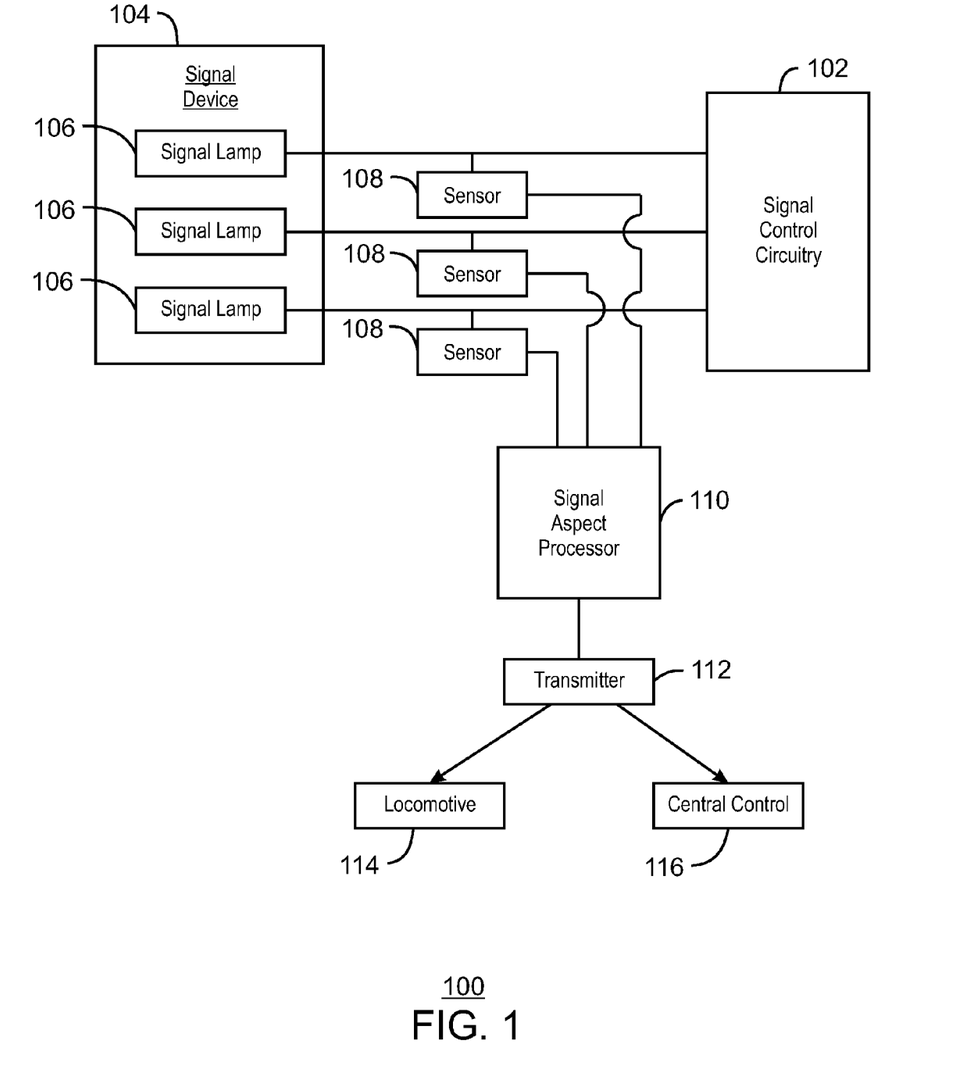
FIG. 1 is a block diagram of a railway signaling system according to an embodiment.

FIG. 1 is a block diagram of a railway signaling system according to an embodiment of the invention. The railway signaling system is referred to by the reference number 100. In embodiments, the railway system 100 may be configured to provide information to a train conductor regarding the state of the railway. For example, the system 100 may be configured to communicate a track switch state or whether a hazard condition exists, such as track flooding, obstructions, and the like. The system 100 can include signaling control circuitry 102 configured to determine a track condition and communicate the information to the signaling device 104. The signaling control circuitry 102 can include one or more detectors, such as train detection, light out detection, switch state detectors, high water detectors, and slide fence detectors, among others. The signaling control circuitry 102 can then communicate the information to the conductor through the signaling device 104 by energizing one or more signal lamps 106. The signaling device 104 may be positioned along the track at a location viewable by the conductor, thus allowing the conductor enough lead time to react to the information. A variety of information can be communicated to the conductor based on the combination of signal lamps 106 that are energized. The overall state of the signaling device 104, based on the combination of signal lamps 106 that are energized, is referred to as the "signal aspect" of the signaling device 104. The signal aspect can inform the conductor regarding his authority to move, the presence of hazards, as well as other information.

In embodiments, the system can also include sensors 108 used to sense the signal aspect of the signaling device 104. The sensor 108 may be configured in a current sensing mode or a voltage sensing mode. In the current sensing mode, the sensors 108 may be disposed in series with the conductors used to energize the signal lamps 106. In the current sensing mode, the data from the sensors 108 is proportional to the current used to energize the signal lamps 106. In the voltage sensing mode, the sensors 108 may be disposed adjacent to the conductors used to energize the signal lamps 104 and in parallel with the signal lamps 106. In the voltage sensing mode, the sensors 108 directly measure a current, but the data provided by the sensors 108 is proportional to the voltage across the signal lamp 106. In this way, the sensors can detect the voltage or current being used to energize the signal lamps 106 to determine whether the corresponding signal lamp is on, off, or flashing. Accordingly, it will be appreciated that although the sensors 108 may be referred to as directly measuring current, the sensors 108 may also be configured to detect voltage when configured in the voltage sensing mode. By configuring the sensors 108 in a voltage sensing mode, the sensors 108 may be deployed in existing railway signaling systems without having to temporarily disconnect the existing wiring.

The system 100 can also include a signal aspect processor 110 operatively coupled to the sensors 108 and a transmitter 112 operatively coupled to the signal aspect processor 110. Output from the sensors 108 can be sent to the signal aspect processor 110, which may be configured to determine the signal aspect based on the combination of on, off, and flashing signal lamps. The signal aspect processor 110 can then communicate the signal aspect through the transmitter 112. In embodiments, the transmitter 112 is a wireless transmitter that communicates the signal aspect to a locomotive 114. In this way, the signal aspect can be available to the conductor long before the signaling device 104 actually comes into view. Further, the signal aspect can also be transmitted to a central control facility 116.

Embodiments of the invention provide a voltage or current sensor 108 that employs a variety of techniques intended to protect against false readings. In railway signaling systems 100, more permissive conditions are generally indicated by energizing or flashing signal lamps, whereas more restrictive conditions are generally indicated by de-energizing signal lamps. Embodiments of the invention provide a failsafe voltage or current sensor that protects against indicating that the signal lamp is on or flashing when the signal lamp is actually off. Embodiments of the voltage or current sensor 108 can be better understood with reference to FIG. 2.

Figure 2:
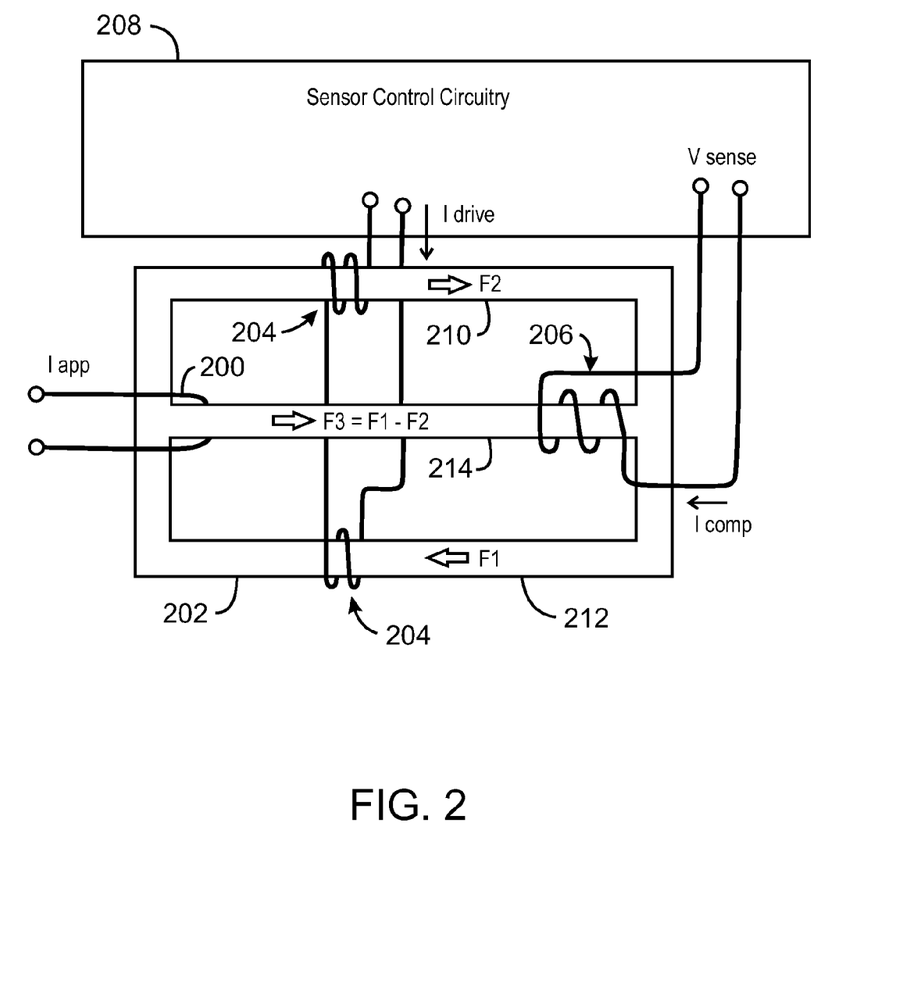
FIG. 2 is a block diagram of a current sensor according to an embodiment.

FIG. 2 is a block diagram of a voltage or current sensor according to an embodiment of the invention. The voltage or current sensor 108 is configured to detect the current flowing through a conductor, referred to herein as the application winding 200. In the current sensing mode, the application winding 200 is configured to be connected in series with, and coupling electrical power to, the signal lamp 106 (FIG. 1). In the voltage sensing mode, the application winding 200 may be coupled, through a resistor, to the conductor used to energize the signal lamp 106 and disposed in parallel with the signal lamp 106. Although embodiments of the techniques are described in reference to railway systems, it will be appreciated that a voltage or current sensor in accordance with embodiments may be employed in a wide variety of systems that use voltage or current sensing.

The current sensor 108 can include a magnetic core 202, a drive winding 204, a sense winding 206, application winding 200, and sensor control circuitry 208 (in certain embodiments, the sensor control circuitry is referred to as a voltage or current detection device, meaning a device that operates with the core, etc., as part of the sensor, for detecting current or voltage). The core 202 can include any suitable magnetically permeable material, including ferromagnetic materials such as iron. In embodiments, the core 202 includes a first outer leg 210 and a second outer leg 212 and a central leg 214. The drive winding 204 provides a drive current, $I_{drive}$, that induces a magnetic flux in the core 202 and drives the core 202 to cyclical magnetic saturation at a specified frequency. The drive winding 204 can be configured such that the magnetic flux induced in the first outer leg 210 by the drive current is equal in magnitude and opposite in polarity compared to the magnetic flux induced in the second outer leg 212. The flux induced in the central leg 214 by the drive winding 204 will be the difference between the flux in the first outer leg 210 and the second outer leg 212. Because the flux polarities are reversed between the first outer leg 210 and second outer leg 212, the flux in the central leg 214 should balance to zero if no additional external flux is introduced to the core 202.

The sense winding 206 can be wrapped around the central leg 214 of the core 202, as shown in FIG. 2. If there is current flow in the application winding 200, there will be a corresponding offset in the total flux in the central leg 214 of the core 202, resulting from a flux imbalance between the two legs of the core 202. This flux imbalance induces a voltage signal in the sense winding 206 with a frequency at the second harmonic of the drive frequency and in phase with the drive frequency. Thus, the second harmonic voltage signal induced in the sense winding 206 can be used to measure the presence of an application current, $I_{app}$, present in the application winding 200.

Both the drive winding 204 and the sense winding 206 can be operatively coupled to the sensor control circuitry 208. The sensor control circuitry 208 provides the drive current, $I_{drive}$, to the drive winding 204 and monitors the sense winding 206 to determine whether an application current is present. In embodiments, the sense winding voltage, $V_{sense}$, is used in a feedback loop to drive an additional compensation current, $I_{comp}$, into the magnetic core 202 through the sense winding 202 to balance the overall flux in the core, thereby reducing the second harmonic voltage signal. The compensation current, $I_{comp}$, is proportional to the application current, $I_{app}$. The application current can be determined based on a transfer function that depends on a ratio of the number of turns of the sense winding 206 to the number of turns of the application winding 200. In embodiments, the sensor control circuitry 208 implements one or more techniques for reducing the probability of generating a false reading, as discussed further below in reference to FIGS. 4 and 6. The operation of the voltage or current sensor 108 may be better understood with reference to FIG. 3.

Figure 3:
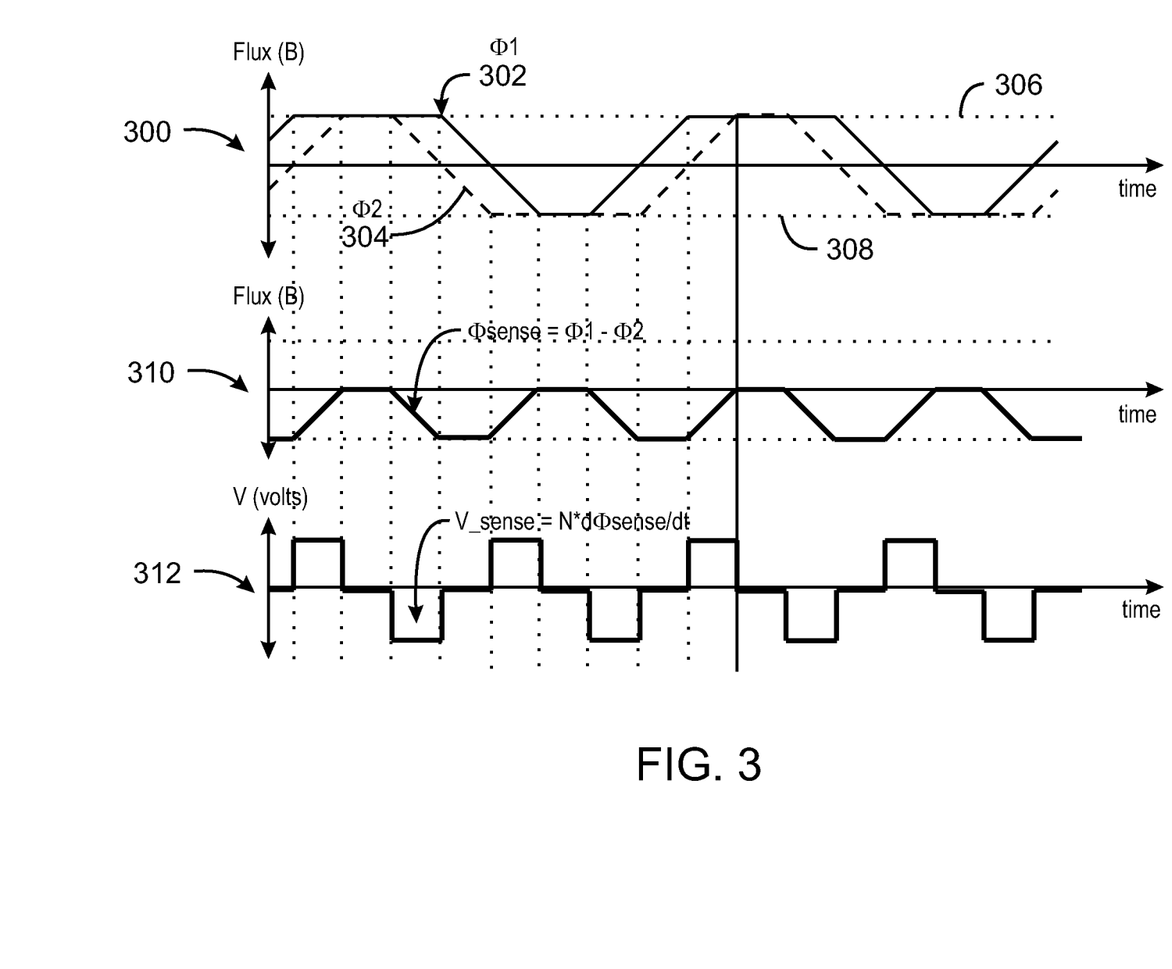
FIG. 3 is a set of timing diagrams that show the signals induced in the core of the current sensor.

FIG. 3 is a set of timing diagrams that show the signals induced in the core of the current sensor. A first timing chart 300 shows the flux in both legs of the core 202 that are induced by the drive current, $I_{drive}$. The flux in the first leg, $\Phi_1$, is shown by the solid line 302 while the flux in the second leg, $\Phi_2$, is shown by the dashed line 304. It will be appreciated that the waveforms shown in FIG. 3 are idealized waveforms used to explain the embodiments of the present techniques, and that other waveforms may possible depending on the particular implementation. As shown in the first timing chart 300, the flux in both legs of the core is driven to the magnetic saturation limit of the core material as indicated by the dotted lines 306 and 308. Further, the flux in both legs of the core 202 are under the influence of a magnetic field from the application current that causes an offset in the flux of the first leg compared to the flux in the second leg. In this condition, the core may be referred to as being imbalanced.

The second chart 310 shows the net flux difference, $\Phi_1 - \Phi_2$, between the two legs of the core. It can be observed that the resulting net flux difference varies cyclically at the second harmonic of the drive frequency. The net flux difference induces a voltage in the sense winding, which is shown in the third chart 312. The third chart 312 shows the corresponding voltage signal, $V_{sense}$, cause by the net flux difference between the two legs of the core, which may be calculated according to the following formula, wherein N equals the number of turns of the sense winding 206.

$$V_{sense} = N \frac{d(\Phi 1 - \Phi 2)}{dt}$$

Figure 4:
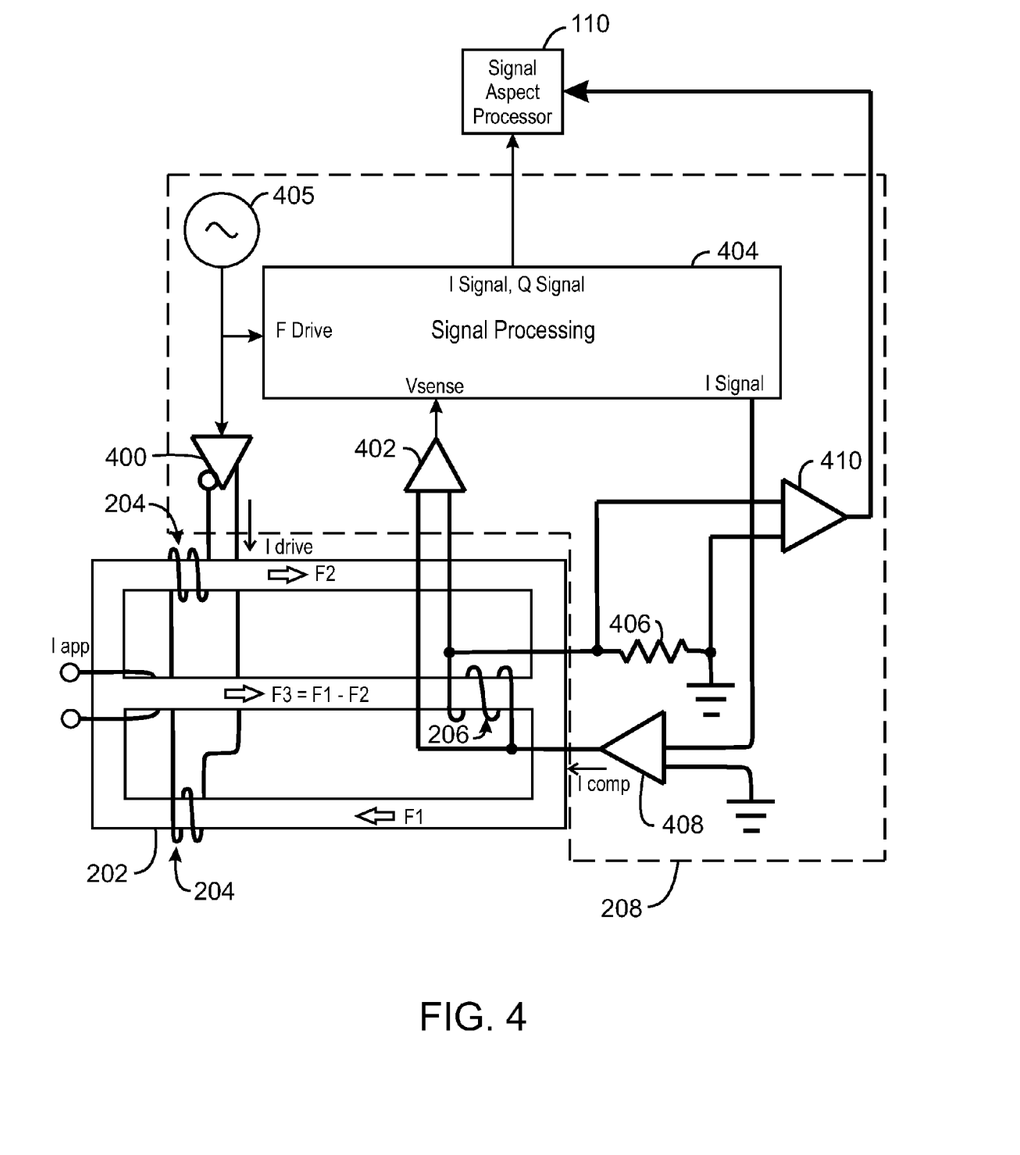
FIG. 4 is a block diagram of sensor control circuitry according to an embodiment.

FIG. 4 is a block diagram of sensor control circuitry according to an embodiment of the invention. As stated above, the sensor control circuitry 208 is configured to reduce the likelihood of a failure mode in which an "on" or flashing state is indicated when the current in the conductor is off. Such a failure mode could occur in a traditional fluxgate sensor due to external magnetic interference at the second harmonic of the drive frequency, electrical interference from or short circuit to another fluxgate sensor, or a memory effect (remanence) that produces magnetic latency in the core, among others.

To protect against these failures, the voltage or current sensor includes failsafe design features that create a more reliable current sensor. The functional blocks shown in FIG. 4 are intended to facilitate the description of various features of the voltage or current sensor in accordance with embodiments. The functional blocks described herein may be implemented using a variety of circuit elements, including analog and digital components such as operational amplifiers, transistors, capacitors, switches, logic circuits, processors, integrated circuits, memory devices, analog-to-digital converters, and digital-to-analog converters, among others. In embodiments, components of the sensor control circuitry may be implemented in an application-specific integrated circuit (ASIC), a field-programmable gate array (FPGA), or the like. Accordingly, it will be appreciated that embodiments described herein may be implemented using any suitable circuit configuration known to those of ordinary skill in the art.

As shown in FIG. 4, the sensor control circuitry 208 can include drive circuitry 400, sense circuitry 402, and signal processing circuitry 404. The drive circuitry 400 is coupled to the drive winding 204 for delivering the drive current, $I_{drive}$, to the core 202, as described above in relation to FIG. 2. The drive circuitry 400 can include, for example, digital gates used as class D amplifiers to drive a signal, such as a square wave signal, into the drive winding at the desired frequency. A signal generator 405 may be coupled to the input of the drive circuitry 400. The signal generator 405 generates a sinusoidal signal, $F_{drive}$, which is used to control the frequency and timing of the drive current provided by the drive circuitry 400. During integrity tests this drive current signal may be temporarily disabled. In embodiments, the frequency of this drive current signal is varied in order to separate the signals related to the sensor from signals associated with potential interference.

The sense circuitry 402 may be coupled to the sense winding 206 for detecting the second harmonic voltage signal, $V_{sense}$, generated by the flux imbalance in the core, as discussed above in relation to FIG. 3. The sense circuitry 402 may include, for example, an analog-to-digital converter and a digital signal processor configured to extract the second harmonic content of the sense winding signal. The analog-to-digital converter and a digital signal processor may be implemented, for example, in a Field Programmable Gate Array (FPGA).

The sense circuitry 402 can be operatively coupled to the signal processing circuitry 404, which is configured to sample the sense winding voltage at discrete intervals. The signal processing circuitry may be implemented, for example, in programmable logic, which may include a feedback control loop that is programmed to nullify any offset in the core flux caused by application current. The signal processing circuitry 404 may also include the data processing circuits for an IQ processing technique as well as a scheduler and control circuit for running the periodic integrity tests. In embodiments, the signal processing circuitry 404 implements an IQ signal sampling technique, wherein the sense voltage, $V_{sense}$, is mixed with a sinusoid at twice the frequency of the drive current and also with a 90 degree phase shifted version of the sinusoid at twice the frequency of the drive current, resulting in I and Q data samples. The I and Q data samples will be phase locked with the drive signal, such that the I samples will be in phase with the drive signal and the Q samples will be out of phase with the drive signal. An exemplary IQ signal processing technique is describe further below in reference to FIG. 5.

To implement the feedback loop discussed above in relation to FIG. 2, the sensor control circuitry 208 can also include a compensation circuit 408, which may be configured to generate the compensation current, $I_{comp}$. The magnitude of the compensation current can be determined by the signal processing circuitry 404 based on the magnitude of the I data samples. In other words, the feedback loop is configured such that compensation current used to balance the magnetic core 202 is designed to operate from the I data samples, which are in phase with the drive signal. The result is that the current sensor 108 only responds to external magnetic fields that are locked in phase with the drive signal, making it much less susceptible to random external interference at the second harmonic of the drive frequency.

The output of the voltage or current sensor 108 may be an indicator that identifies a characteristic of the application current detected in the conductor 200 and may be based on the magnitude of the compensation current. For example, the output may be a state indicator that indicates whether the corresponding signal lamp is on based on whether an application current is detected. Additionally, the output may be a digital or analog signal with a value proportional to the compensation current and, thus, the application current. In embodiments, the output of the current sensor 108 may be communicated to the signal aspect circuitry 110 for further processing, as described above in relation to FIG. 1.

To protect against incorrect sensor readings due to an external signal that might be in phase with the drive current, the sensor control circuitry 208 may be configured to periodically execute an integrity test, wherein the sensor control circuitry 208 turns off the drive current and checks the sense signal.

With the drive current turned off, the second harmonic of the sense signal should drop to zero unless there is an interfering signal in phase with the drive current at the second harmonic of the drive frequency. Thus, if the second harmonic of the sense signal does not drop to zero when the drive current is turned off, this would indicate the presence of an external magnetic interference that could negatively affect the operation of the current sensor 108. In such cases, the sensor control circuitry 208 can indicate a fault condition to the signal aspect processor 110, for example, by generating an error code or indicating a failed voltage or current sensor. In either case, the sensor control circuitry may take the voltage or current sensor to its most restrictive state. To further reduce the probability of external interference occurring outside of the times when the integrity tests are performed, the integrity test may be performed at random intervals.

In some embodiments, a plurality of voltage or current sensors 108 may be used to monitor a plurality of signal lamps of a given system, such as the signaling system 100 of FIG. 1. As a result there may be magnetic fields present from each of the voltage or current sensors 108 that could negatively impact any of the other voltage or current sensors 108. To protect against this, differentiating features may be added to each voltage or current sensor 108 to reduce the probability of cross interference between different voltage or current sensors 108. These differentiating features may be implemented in several ways. In an embodiment, each current sensor 108 may be operated with a different drive frequency. In this way, the feedback loop is effectively tuned to be immune to magnetic fields from any of the other voltage or current sensors 108 in the system. In embodiments, the drive current of each voltage or current sensor 108 could be driven to establish a phase difference relative to the other voltage or current sensors 108. In this way, the second harmonic signal generated by one voltage or current sensor would be out of phase with respect to the drive frequency of every other voltage or current sensor in the system. This design feature, coupled with the IQ sampling of the feedback loop described above, would make each voltage or current sensor immune to the magnetic fields from other voltage or current sensors 108 in the system. In an embodiment, the drive current may be modulated to generate a unique signature that can be detected on the second harmonic signal of the voltage or current sensor 108. For example, the drive current could be amplitude modulated, phase modulated, frequency modulated, and the like. If second harmonic sense signal received by the signal processing circuitry 404 does not exhibit the unique signature, this can serve as an indication the received signal is due to external interference.

Other types of integrity checks may be performed to protect against failure modes related to internal failure of the current sensor. Any circuit with magnetic cores has the potential to produce a stale flux condition due to the magnetic remnance in the magnetic materials used in the core 202. Additionally, the feedback loop could fail in such a way that the magnetic core appears to be balanced when it is not. Further, the compensation circuit 408 could fail, independently of the feedback loop, in such a way that it no longer approximates the application current. To protect against such internal failures, an integrity test can be performed wherein the compensation current is periodically driven in the opposite direction indicated by the feedback loop to force the core 202 out of balance. When the compensation current is driven in the opposite direction, the sense circuitry 402 should detect a large second harmonic signal if the voltage or current sensor 108 is operating properly. Thus, if a large second harmonic signal is not detected by the circuitry, this would indicate that the voltage or current sensor is not functioning properly. In such cases, the sensor control circuitry 208 can indicate a fault condition and take the voltage or current sensor to its most restrictive state, as described above.

In an embodiment, the sensor 108 may be taken off-line on a periodic basis and the feedback loop forced to generate a specific second harmonic signal signature. For example, the second harmonic signal signature may be a balanced AC or sinusoidal waveform with an amplitude that decreases as time progresses. Introducing the second harmonic signal signature to the core 202 through the feedback loop may provide several advantages. For example, the flux imbalance generated in the core 202 as a decaying AC waveform, may reduce magnetic remanence in the portions of the magnetic core 202 that are not cyclically saturated, thus increasing the accuracy of the sensor. Furthermore, the second harmonic signal signature introduced to the core 202 through the feedback loop should result in a corresponding second harmonic content being received by the sense circuitry 402. If the second harmonic content is not detected by the sense circuitry 402, this may indicate that the sensor 108 is not operating properly. In such cases, the sensor control circuitry 208 can indicate a fault condition and take the voltage or current sensor to its most restrictive state, as described above.

In an embodiment, the introduction of the second harmonic signal signature as the target for the feedback loop may be used to verify that the sensor is sufficiently sensitive to current imbalance. A higher sensor 108 sensitivity would be indicated by a smaller compensation current signature signal. A lower sensitivity would be indicated by a larger compensation current signature signal, or possibly by an inability of the feedback loop to cause the detected second harmonic signal to track the commanded signature. The sensitivity may be computed as the magnitude of the measured second harmonic of the sense signal, divided by the magnitude of the compensation current signature signal. The compensation current signature signal may be determined, for example, by measuring the voltage across the resistor 406 using compensation current sensor circuit 410. In an embodiment, the output of the compensation current sensor circuit 410 may be sent to the signal aspect processor 110, which computes the sensor 108 sensitivity. If the sensor sensitivity is below a specified threshold the sensor control circuitry 208 can indicate a fault condition and take the voltage or current sensor to its most restrictive state, as described above.

It will be appreciated that the particular circuit configuration shown in FIG. 4 is but one example of a suitable sensor control circuitry 208 that may be employed in accordance with embodiments. In embodiments, the sensor control circuitry 208 may employ a check-redundant configuration, wherein the sensor control circuitry contains two or more instances of the components shown in FIG. 4. For example, in the check-redundant configuration, the sensor control circuitry 208 may include two sense amplifiers 402 and two signal processors 404, each coupled to the same sense winding 206 with their own current sense resistor 406 (one at each end of sense coil 206). The signal aspect processor 110 may receive data from each of the two signal processors and the two compensation current measurements and compare them in order to detect potential circuit faults.

Figure 5:
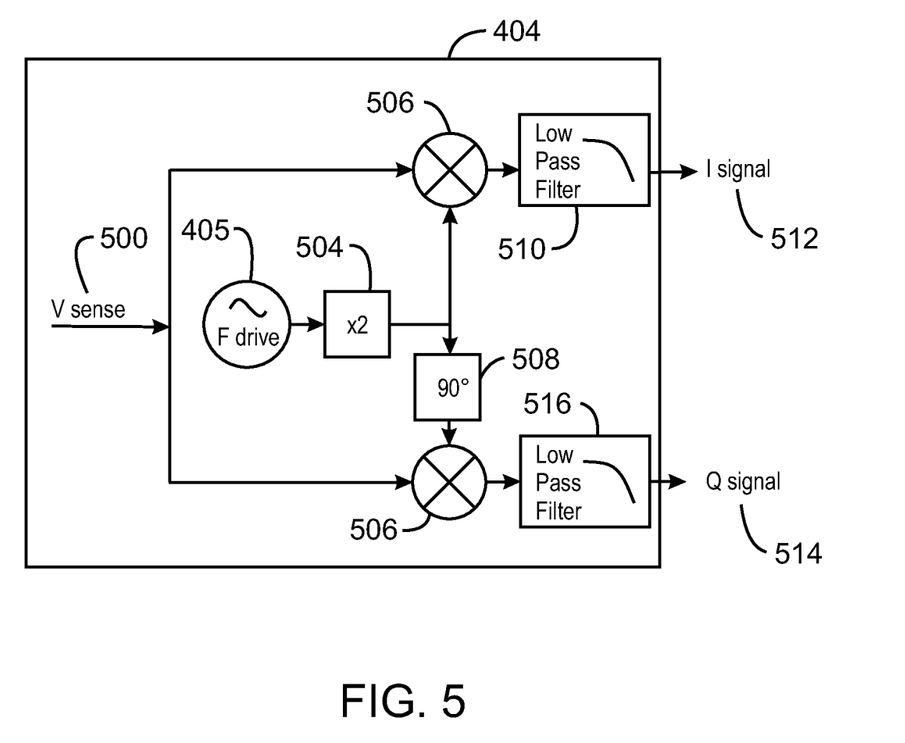
FIG. 5 is a block diagram of IQ signal processing circuitry, in accordance with embodiments.

FIG. 5 is a block diagram of IQ signal processing circuitry, in accordance with embodiments. The IQ signal processing circuitry may be included in the signal processing circuitry 404 and used to implement the IQ signal sampling technique discussed above in relation to FIG. 4. In an embodiment, the signal processing circuitry 404 implements an IQ signal sampling technique, wherein the sense voltage is mixed with a sinusoid at twice the frequency of the drive current and also with a 90° phase shifted version of twice the frequency of the drive current. In FIG. 5, element 500 represents the sense voltage, $V_{sense}$, received from the sense circuitry 402, and element 405 represents a sinusoidal signal, $F_{drive}$, in phase with the drive current, $I_{drive}$, and generated by the drive circuitry 400. The sinusoidal signal 405 is passed through a frequency multiplier 504 that doubles the frequency of the sinusoidal signal 405, resulting in a signal referred to herein as the "reference signal." The reference signal is mixed with the sense voltage 500 at mixers 506 after a phase shifter 508 applies a 90 degree phase shift to the reference signal fed to one of the mixers 506. The output of the mixers 506 may be low pass filtered by filters 510. The resulting output is in an I signal 512 in phase with the drive current and a Q signal 514 that is 90 degrees out of phase with the drive current. The I signals 512 and Q signals 514 represent the in phase (I) and the quadrature (Q) 2× F drive content in the $V_{sense}$ signal. Any phase shifts between the sinusoidal signal, $F_{drive}$, and the actual current in the drive winding will result in a rotation in the [I, Q] measurement. In practice this [I, Q] pair may be rotated to compensate for any phase shifts present in the system. As described above, the I signal 512 may be used to drive the compensation current of the feedback loop.

Figure 6:
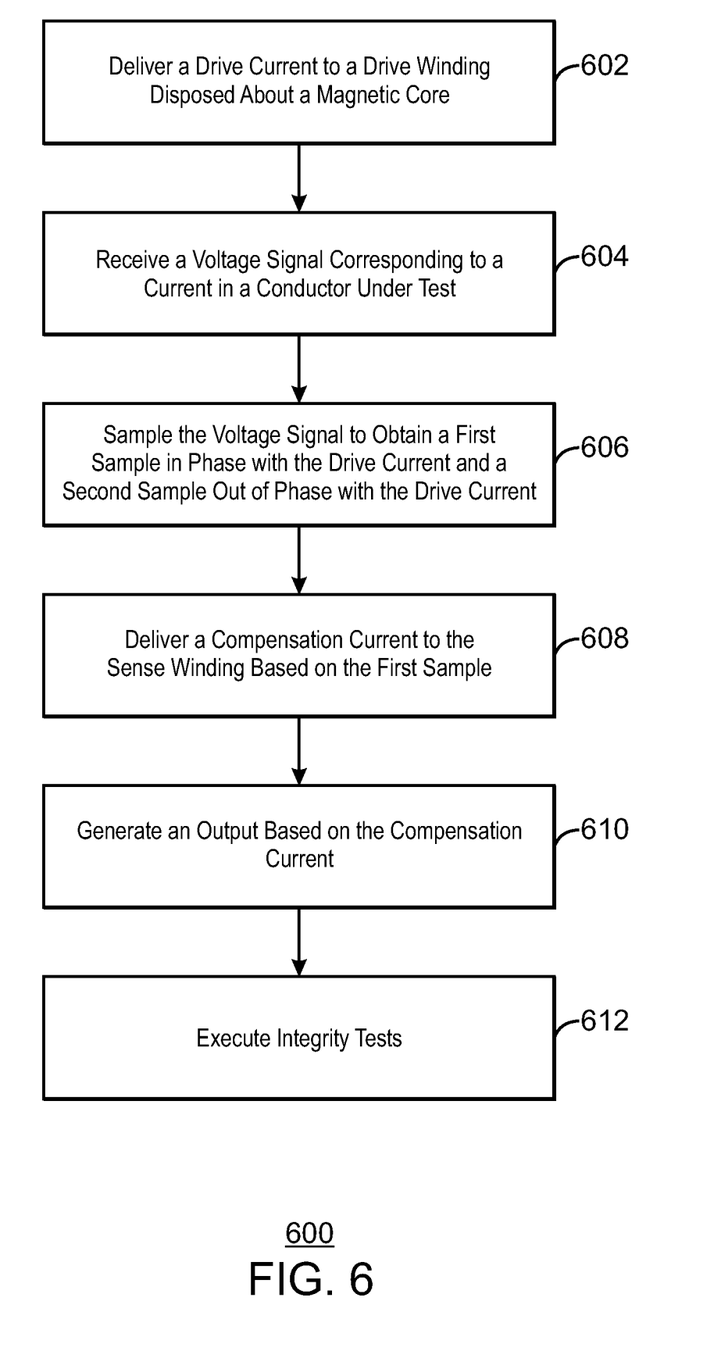
FIG. 6 is a process flow chart summarizing a method of sensing current according to an embodiment.

FIG. 6 is a process flow chart summarizing a method of sensing voltage or current according to an embodiment of the invention. The method is referred to by the reference number 600 and can be implemented by the voltage or current sensor 108 described above in reference to FIGS. 2-4. The method 600 may begin at block 602, wherein a drive current is delivered to a drive winding disposed about a magnetic core. The drive current drives the core to cyclical magnetic saturation, as shown in FIG. 3. In embodiments, the drive frequency of the drive current is selected to be different from the drive frequency of other current sensors that may be nearby, for example within the same current sensing package. In embodiments, the drive current may be modulated to generate a signature on the voltage signal that may be received by the sense circuitry to verify the proper operation of the current sensor.

At block 604, a voltage signal is received corresponding to the application current in a conductor under test. The voltage signal is received from the sense winding, which is configured to respond to a second harmonic signal generated in the core by the presence of the magnetic field generated by the conductor under test.

At block 606, the voltage signal may be sampled such that a first data sample is in phase with the drive current and a second data sample is out of phase with the drive current. If the drive current is modulated, a determination may be made regarding whether the voltage signal exhibits the expected modulation. If the sense voltage does not exhibit the expected modulation, the voltage signal may be influenced by a source of interference or some internal error, in which case, the output of the current sensor may be set to set to a restrictive state.

At block 608, the compensation current is delivered back to the sense winding, for example, by a feedback loop. The magnitude of the compensation current is controlled by the feedback loop to balance the magnetic core. When the core is balanced, the magnitude of the compensation current may be proportional to the magnitude of the application current present in the conductor under test. Furthermore, the compensation current is based on the first data sample, which is in phase with the drive current.

At block 610, an output of the current sensor may be generated based on the compensation current. As described above, the output of the current sensor indicates whether an application current is detected in the conductor under test. The output can, be used to indicate whether voltage or current is detected, the magnitude of the voltage or current detected, and whether a condition exists that could be preventing proper operation of the current sensor.

At block 612, one or more integrity tests may be executed. As discussed above, the integrity tests may test for possible magnetic or electrical interference or internal failure due, for example, to a fault in one or more of the mechanisms that generate and detect the second harmonic to reduce magnetic remanence in the magnetic materials used in the core and determine sensitivity of the current sensor. An example of an integrity test includes terminating the drive current and sampling the voltage signal to determine whether external interference is generating a second harmonic signal that is received by the sense circuitry. Another example of an integrity test includes driving the core out of balance by driving the compensation current with a polarity opposite of that indicated by the feedback loop and sampling the voltage signal to determine whether the voltage signal experiences a corresponding rise in magnitude. Another example of an integrity test includes driving the compensation current to generate a signature signal onto the second harmonic content of the of the sense signal. The magnitude of the compensation current may be used to determine the sensitivity of the current sensor. Failure of the current sensor may be detected by an excessively high compensation current or a failure of the feedback loop to produce the desired signature signal on the sense winding. The integrity test may be executed at regular time intervals or random time intervals. The integrity tests are discussed further above in relation to FIG. 4.

Another embodiment relates to a voltage or current detection device. The device comprises drive circuitry configured to deliver a drive current to a magnetic core operably coupled with a conductor, for driving the core to cyclical magnetic saturation. ("Operably coupled with" includes disposed about, disposed adjacent to, disposed in series with, or otherwise arranged for magnetic interaction between the conductor and core.) The device further comprises sense circuitry configured to receive a voltage signal corresponding to an application current in the conductor. The device further comprises signal processing circuitry configured to sample the voltage signal, such that a first sample is in phase with the drive current and a second sample is out of phase with the drive current. The device further comprises a feedback loop (e.g., feedback loop circuitry) configured to deliver a compensation current to the magnetic core. The compensation current is configured to balance the magnetic core. Additionally, the compensation current is based on the first sample in phase with the drive current. In one aspect, "deliver" a current to the magnetic core means providing the current in relation to the core, such as through a winding or other conductor, so as to create or drive magnetic flux in the core in correspondence with the current, based on electromagnetic interaction between the current and core.

In another embodiment of the detection device, the device is configured to execute an integrity test. When executing the integrity test, the drive circuitry is operated to terminate the drive current, and the signal processing circuitry is operated to sample the voltage signal to determine whether an external interference is generating a second harmonic signal that is received by the sense circuitry. "Is operated" includes being configured to operate as indicated and/or being controlled to operate as indicated. According to one aspect, the device is configured to execute the integrity test periodically at random time intervals.

Another embodiment relates to a system that comprises a first voltage or current detection device (as described above) and a second voltage or current detection device (also as described above). Each is configured to deliver a first and second drive current, respectively, to different magnetic cores. A frequency of the first drive current of the first device is different from a frequency of the second drive current of the second device.

Another embodiment relates to a voltage or current detection device for detecting a voltage or current in a conductor. The detection device is configured for use with a magnetic core having a drive winding and a sense winding, and which is configured to be operably coupled with the conductor. ("Operably coupled with" includes disposed about, disposed adjacent to, disposed in series with, or otherwise arranged for magnetic interaction between the core and conductor.) Each winding of the magnetic core is distinct from the other winding (meaning not part of the same length of winding conductor), and each is magnetically coupled with the core. The detection device comprises drive circuitry configured to deliver a drive current to the magnetic core, through the drive winding, for driving the core to cyclical magnetic saturation. The detection device further comprises sense circuitry configured to receive a voltage signal across the sense winding; the voltage signal corresponds to an application current in the conductor. The detection device further comprises signal processing circuitry configured to sample the voltage signal, such that a first sample is in phase with the drive current and a second sample is out of phase with the drive current. The detection device further comprises a feedback loop (e.g., feedback loop circuitry) configured to deliver a compensation current to the magnetic core, through the sense winding. The compensation current is configured to balance the magnetic core. Additionally, the compensation current is based on the first sample in phase with the drive current.

Another embodiment relates to a sensor for detecting a voltage or current in a conductor. The sensor includes a detection device (e.g., sensor control circuitry 208) and a sensor unit. The sensor unit comprises a magnetic core, a drive winding, and a sense winding. Each winding is distinct from the other winding (meaning not part of the same length of winding conductor), and each is magnetically coupled with the core. The sensor unit is configured to be operably coupled with the conductor. ("Operably coupled with" includes disposed about, disposed adjacent to, disposed in series with, or otherwise arranged for magnetic interaction between the conductor and core.) The detection device comprises drive circuitry electrically connected to the drive winding. The drive circuitry is configured to deliver a drive current to the magnetic core, through the drive winding, for driving the core to cyclical magnetic saturation. The detection device further comprises sense circuitry electrically connected to the sense winding. The sense circuitry is configured to receive a voltage signal across the sense winding; the voltage signal corresponds to an application current in the conductor. The detection device further comprises signal processing circuitry configured to sample the voltage signal, such that a first sample is in phase with the drive current and a second sample is out of phase with the drive current. The detection device further comprises a feedback loop (e.g., feedback loop circuitry) electrically connected to the sense winding. The feedback loop is configured to deliver a compensation current to the magnetic core, through the sense winding. The compensation current is configured to balance the magnetic core. Additionally, the compensation current is based on the first sample in phase with the drive current.

Another embodiment relates to a sensor for detecting a voltage or current in a conductor. The sensor includes a detection device (e.g., sensor control circuitry 208) and a sensor unit. The sensor unit comprises a magnetic core, a drive winding, and a sense winding. Each winding is distinct from the other winding (meaning not part of the same length of winding conductor), and each is magnetically coupled with the core. The sensor unit is configured to be operably coupled with the conductor. The detection device comprises drive circuitry, sense circuitry, signal processing circuitry, and a feedback loop. The drive circuitry is configured to deliver a drive current to the drive winding, for driving the core to cyclical magnetic saturation, when the drive circuitry is electrically connected to the drive winding and the detection device is operated. The sense circuitry is configured to receive a voltage signal from the sense winding, when (i) the sense circuitry is electrically connected to the sense winding, (ii) the detection device is operated, (iii) the sensor unit is operably coupled with the conductor ("operably coupled with" includes disposed about, disposed adjacent to, disposed in series with, or otherwise arranged for magnetic interaction between the conductor and core), and (iv) an application current is present in the conductor, which creates a magnetic flux in the magnetic core and correspondingly the voltage signal is induced in the sense winding. The signal processing circuitry is configured to sample the voltage signal, when the detection device is operated and the voltage signal is present. The feedback loop is configured to deliver a compensation current to the sense winding, when the feedback loop is electrically connected to the sense winding, when the detection device is in operation, and when the signal processing circuitry is operating to provide samples of the voltage signal. The feedback loop is configured to generate the compensation current based at least in part on the samples of the voltage signal as provided from the signal processing circuitry. For example, in an embodiment, the signaling processing circuitry is configured to sample the voltage signal to obtain a first sample in phase with the drive current and a second sample out of phase with the drive current; the feedback loop is configured for the compensation current to balance the magnetic core, and to generate the compensation current based on the first sample in phase with the drive current.

Another embodiment relates to a sensor for detecting a voltage or current in a conductor. The sensor includes a detection device (e.g., sensor control circuitry 208) and a sensor unit. The sensor unit comprises a magnetic core, a drive winding, and a sense winding. Each winding is distinct from the other winding (meaning not part of the same length of winding conductor), and each is magnetically coupled with the core. The sensor unit is configured to be operably coupled with the conductor. The detection device comprises drive circuitry, sense circuitry, signal processing circuitry, and a feedback loop. For installation, the sensor unit is operably coupled with the conductor. ("Operably coupled with" includes disposed about, disposed adjacent to, disposed in series with, or otherwise arranged for magnetic interaction between the conductor and core.) Additionally, the drive circuitry is electrically connected to the drive winding, and the sense circuitry and/or the feedback loop are electrically connected to sense winding. During operation, the drive circuitry is configured to deliver a drive current to the drive winding, for driving the core to cyclical magnetic saturation. The sense circuitry is configured to receive a voltage signal from the sense winding. The voltage signal is induced in the sense winding based on magnetic flux in the core, which is present due to an application current passing through the conductor. (The application current, and/or a voltage relating thereto, is the current or voltage to be detected by the system; that is, the system is operational to detect current or voltage of the conductor.) The signal processing circuitry is configured to sample the voltage signal. The feedback loop is configured to deliver a compensation current to the sense winding; the compensation current is based at least in part on the samples of the voltage signal as provided from the signal processing circuitry. For example, in an embodiment, the signaling processing circuitry is configured to sample the voltage signal to obtain a first sample in phase with the drive current and a second sample out of phase with the drive current; the feedback loop is configured for the compensation current to balance the magnetic core, and to generate the compensation current based on the first sample in phase with the drive current.

Another embodiment relates to a voltage or current detection device. The detection device comprises drive circuitry configured to deliver a drive current to a magnetic core operably coupled with a conductor, for driving the core to cyclical magnetic saturation. (The drive current has a drive frequency.) The detection device further comprises sense circuitry configured to receive a voltage signal corresponding to an application current in the conductor. The detection device further comprises a feedback loop configured to deliver a compensation current to the magnetic core, to balance the magnetic core. The compensation current is based at least in part on a change in the voltage signal in the sense winding due to the application current. The drive circuitry is configured to periodically terminate the drive current, for analysis (e.g., by signal processing circuitry) of the voltage signal to determine whether an external interference is generating a second harmonic signal that is received by the sense circuitry. The drive circuitry may be configured to randomly periodically terminate the drive current.

Another embodiment relates to a sensor for detecting a voltage or current in a conductor. The sensor comprises a sensor unit and a detection device. The sensor unit includes a magnetic core, a sense winding, and a drive winding. The windings are distinct from one another and magnetically coupled with the core. The sensor unit is configured to be operably coupled with the conductor. The detection device comprises drive circuitry configured to deliver a drive current to the magnetic core through the drive winding, for driving the core to cyclical magnetic saturation. (The drive current has a drive frequency.) The device further comprises sense circuitry configured to receive a voltage signal across the sense winding, corresponding to an application current in the conductor. The device further comprises a feedback loop configured to deliver a compensation current to the magnetic core, through the sense winding, to balance the magnetic core. The compensation current is based at least in part on a change in the voltage signal in the sense winding due to the application current. The drive circuitry is configured to periodically terminate the drive current, for analysis (e.g., by signal processing circuitry) of the voltage signal to determine whether an external interference is generating a second harmonic signal that is received by the sense circuitry. The drive circuitry may be configured to randomly periodically terminate the drive current.

In one aspect, "randomly" or "random" means at least non-regularly periodic, such that the device operates with different time periods between when the drive current is present and terminated. In another example, randomly means non-regularly periodic as determined in part by a circuit- or other electronic-based pseudorandom number generator.

Another embodiment relates to a voltage or current detection system for detecting voltages or currents in plural conductors. The system comprises plural sensor units and plural detection devices respectively associated with the sensor units. The detection devices may be stand-alone, or integrated into a common unit; however, each detection device, functionally speaking, is associated with its own sensor unit. Each sensor unit includes a magnetic core, a sense winding, and a drive winding. The windings are distinct from one another and magnetically coupled with the core. Each sensor unit is configured to be operably coupled with a respective one of the plural conductors, and in use, each sensor unit is so coupled. Each detection device comprises drive circuitry configured to deliver a drive current to the magnetic core of its respective sensor unit through the drive winding, for driving the core to cyclical magnetic saturation. (The drive current has a drive frequency.) Each detection device further comprises sense circuitry configured to receive a voltage signal, across the sense winding of its respective sensor unit, corresponding to an application current in the conductor coupled to the sensor unit. Each detection device further comprises a feedback loop configured to deliver a compensation current to the magnetic core of its respective sensor unit, through the sense winding, to balance the magnetic core. The compensation current is based at least in part on a change in the voltage signal in the sense winding 206 due to the application current. In various embodiments, the system is configured in one or more of the following manners: (i) the sensors are configured such that the drive frequency of the drive current of each sensor is different from the drive current frequencies of the other sensors; (ii) for each sensor, the drive frequency of the drive current is configured to establish a phase relationship relative to all other sensors, such that second harmonics from any of the other sensors are out of phase with the drive frequency of the particular sensor; and/or (iii) each detection device includes a modulator for creating a unique (as between the plural sensors) modulation signal portion (i.e., "signature") on the second harmonic of its associated sensor unit.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions, values, and types of materials described herein are intended to illustrate embodiments of the invention, they are by no means limiting and are exemplary in nature. Other embodiments may be apparent upon reviewing the above description. The scope of the invention should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," "third," "upper," "lower," "bottom," "top," "up," "down," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

As used herein, an element or step recited in the singular and proceeded with the word "a" or "an" should be understood as not excluding plural of said elements or steps, unless such exclusion is explicitly stated. Furthermore, references to "one embodiment" of the invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described apparatus for securing an electronic device, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A voltage or current detection device, comprising:
   drive circuitry configured to deliver a drive current to a magnetic core operably coupled with a conductor, for driving the core to cyclical magnetic saturation;
   sense circuitry configured to receive a voltage signal corresponding to an application current in the conductor;
   signal processing circuitry configured to sample the voltage signal, wherein a first sample is in phase with the drive current and a second sample is out of phase with the drive current; and
   a feedback loop configured to deliver a compensation current to the magnetic core, wherein the compensation current is configured to balance the magnetic core and wherein the compensation current is based at least in part on the first sample in phase with the drive current;
   wherein the signal processing circuitry is configured to be operably coupled to a signal aspect processor configured to externally communicate an indicator signal, relating to the voltage signal, for use in controlling vehicles.

2. The voltage or current detection device of claim 1, wherein the device is configured to execute an integrity test in which:
   the drive circuitry is operated to terminate the drive current; and
   the signal processing circuitry is operated to sample the voltage signal to determine whether an external interference is generating a second harmonic signal that is received by the sense circuitry.

3. The voltage or current detection device of claim 2, wherein the device is configured to execute the integrity test periodically at random time intervals.

4. The voltage or current detection device of claim 1, wherein a second voltage or current detection device using a second drive current is disposed in proximity to the core and a frequency of the drive current is different from a second frequency of the second drive current used in the second voltage or current detection device.

5. The voltage or current detection device of claim 1, further comprising a modulator that is configured to modulate the drive current to generate a signature on the voltage signal.

6. The voltage or current detection device of claim 1, wherein the signal processing circuitry is configured to periodically drive the compensation current with a polarity opposite of that indicated by the feedback loop, for periodically driving the magnetic core out of balance.

7. The voltage or current detection device of claim 1, wherein the feedback loop is configured to periodically drive the magnetic core to generate a decaying sinusoidal waveform in magnetic flux passing through the magnetic core.

8. The voltage or current detection device of claim 1, wherein the indicator signal indicates at least one of a track switch state and a hazard condition.

9. A signaling system comprising:
   a signal lamp configured to indicate a condition of a railway;
   a voltage or current sensor operably coupled with a conductor corresponding to the signal lamp, the voltage or current sensor configured to detect a state of the signal lamp, the voltage or current sensor comprising:
      a magnetic core disposed about the conductor;
      drive circuitry that delivers a drive current to the magnetic core, wherein the drive current drives the core to cyclical magnetic saturation;
      sense circuitry configured to receive a voltage signal corresponding to an application current in the conductor;
      signal processing circuitry configured to sample the voltage signal, wherein a first sample is in phase with the drive current and a second sample is out of phase with the drive current;
      a feedback loop that drives a compensation current to the magnetic core, wherein the compensation current is configured to balance the magnetic core and wherein the compensation current is based on the first sample in phase with the drive current; and
   a signal aspect processor configured to receive an indicator from the voltage or current sensor, the indicator indicating whether the signal lamp is on, off, or flashing.

10. The signaling system of claim 9, wherein the signal aspect processor is configured to determine a signal aspect of a signaling device corresponding to the signal lamp and to transmit the signal aspect to a locomotive or a central control facility.

11. The signaling system of claim 9, wherein the voltage or current sensor is configured to periodically execute an integrity test in which:
   the drive circuitry is operated to terminate the drive current; and
   the signal processing circuitry is operated to sample the voltage signal to determine whether an external interference is generating a second harmonic signal that is received by the sense circuitry.

12. The signaling system of claim 11, wherein the voltage or current sensor is configured to periodically execute the integrity test at random time intervals.

13. The signaling system of claim 9, comprising a second signal lamp and a second voltage or current sensor operably coupled with a second conductor corresponding to the second signal lamp, wherein the voltage or current sensor and the second voltage or current sensor operate at different drive current frequencies or phases.

14. The signaling system of claim 9, wherein the magnetic core is periodically driven out of balance by driving the compensation current with a polarity opposite of that indicated by the feedback loop.

15. A method of measuring voltage or current, comprising:
   delivering a drive current to a magnetic core, wherein the drive current drives the core to cyclical magnetic saturation;
   receiving a voltage signal corresponding to an application current in a conductor operably coupled with the magnetic core;
   sampling the voltage signal, wherein a first sample is in phase with the drive current and a second sample is out of phase with the drive current;
   delivering a compensation current to the magnetic core, wherein the compensation current is configured to balance the magnetic core and wherein the compensation current is based on the first sample in phase with the drive current; and executing an integrity test comprising:
terminating the drive current; and
sampling the voltage signal to identify the presence of an external interference with a frequency at a second harmonic of the drive current.

16. The method of claim 15, wherein the integrity test is executed periodically at random time intervals.

17. A method of measuring voltage or current, comprising:
delivering a drive current to a magnetic core, wherein the drive current drives the core to cyclical magnetic saturation;
receiving a voltage signal corresponding to an application current in a conductor operably coupled with the magnetic core;
sampling the voltage signal, wherein a first sample is in phase with the drive current and a second sample is out of phase with the drive current;
delivering a compensation current to the magnetic core, wherein the compensation current is configured to balance the magnetic core and wherein the compensation current is based on the first sample in phase with the drive current; and
modulating the drive current to generate a signature on the voltage signal which is received by a sense winding where the voltage signal is present.

18. A method of measuring voltage or current, comprising:
delivering a drive current to a magnetic core, wherein the drive current drives the core to cyclical magnetic saturation;
receiving a voltage signal corresponding to an application current in a conductor operably coupled with the magnetic core;
sampling the voltage signal, wherein a first sample is in phase with the drive current and a second sample is out of phase with the drive current;
delivering a compensation current to the magnetic core, wherein the compensation current is configured to balance the magnetic core and wherein the compensation current is based on the first sample in phase with the drive current; and
periodically driving the core out of balance by driving the compensation current with a polarity opposite of that indicated by a feedback loop and identifying a corresponding increase in the magnitude of the voltage signal, the feedback loop delivering the compensation current.

19. A fluxgate sensor comprising:
a sensor unit; and
a detection device configured to be operably coupled with the sensor unit, wherein the detection device is further configured, when coupled with the sensor unit and when the sensor unit is operably coupled with a conductor, to sample a voltage signal of the sensor unit, the voltage signal induced in the sensor unit by a current passing through the conductor, and to generate a compensation current for the sensor unit based at least in part on the voltage signal as sampled;
wherein a first sample of the voltage signal is in phase with a drive current of the sensor unit and a second sample of the voltage signal is out of phase with the drive current, and wherein the detection device is configured to generate the compensation current based at least in part on the first sample in phase with the drive current.

20. The sensor of claim 19, wherein the sensor unit is configured for the drive current to be delivered to a magnetic core of the sensor unit that is operably coupled with the conductor, for driving the core to cyclical magnetic saturation.

21. The method of claim 15, further comprising sending an indicator to a signal aspect processor, the indicator corresponding to the voltage on or current in the conductor.

22. The method of claim 17, further comprising sending an indicator to a signal aspect processor, the indicator corresponding to the voltage on or current in the conductor.

23. The method of claim 18, further comprising sending an indicator to a signal aspect processor, the indicator corresponding to the voltage on or current in the conductor.

\* \* \* \* \*